(12) United States Patent
Schmit

(10) Patent No.: US 11,128,062 B2
(45) Date of Patent: Sep. 21, 2021

(54) ELECTRONIC ASSEMBLY WITH A DIRECT CURRENT BUS CONNECTION

(71) Applicant: Deere & Company, Moline, IL (US)

(72) Inventor: Christopher J. Schmit, Fargo, ND (US)

(*) Notice: Subject to any disclaimer, the term of this patent is extended or adjusted under 35 U.S.C. 154(b) by 9 days.

(21) Appl. No.: 16/704,627

(22) Filed: Dec. 5, 2019

(65) Prior Publication Data

US 2021/0135380 A1 May 6, 2021

Related U.S. Application Data

(60) Provisional application No. 62/929,010, filed on Oct. 31, 2019.

(51) Int. Cl.
*H01R 4/46* (2006.01)
*H02M 7/00* (2006.01)

(52) U.S. Cl.
CPC .............. *H01R 4/46* (2013.01); *H02M 7/003* (2013.01)

(58) Field of Classification Search
CPC ........ H01R 4/46; H02M 7/003; H05K 7/1432
See application file for complete search history.

(56) References Cited

U.S. PATENT DOCUMENTS

| 6,212,086 | B1 | 4/2001 | Dinh |
| 7,888,601 | B2* | 2/2011 | Bax .......................... H01R 4/30 174/252 |
| 8,851,356 | B1 | 10/2014 | Holec et al. |
| 10,384,548 | B2* | 8/2019 | Ratadiya ................... H02J 1/00 |
| 2003/0079341 | A1 | 5/2003 | Miyake et al. |
| 2010/0089641 | A1 | 4/2010 | Esmaili et al. |
| 2010/0178813 | A1 | 7/2010 | Holbrook |

OTHER PUBLICATIONS

European Search Report issued in counterpart application No. 20203193.6 dated Mar. 24, 2011 (08 pages).

* cited by examiner

*Primary Examiner* — Briggitte R. Hammond

(57) ABSTRACT

A folded outer tab comprises a first outer dielectric layer and a second outer dielectric layer that contact or overlie an outer terminal, where the outer terminal is associated with a first polarity of the DC bus. A bent inner tab comprises a first inner dielectric layer and a second inner dielectric layer that contact or overlie an inner terminal, where the inner terminal is associated with a second polarity of the DC bus that is opposite the first polarity. The folded outer tab and the bent inner tab comprise electrically conductive faces, of opposite polarities, formed of exposed portions of the outer terminal and the inner terminal.

12 Claims, 7 Drawing Sheets

ELECTRONIC ASSEMBLY WITH A DIRECT CURRENT BUS CONNECTION

RELATED APPLICATIONS

This document (including the drawings) claims priority and the benefit of the filing date based on U.S. provisional application No. 62/929,010, filed Oct. 31, 2019 under 35 U.S.C. § 119 (e), where the provisional application is hereby incorporated by reference herein.

GOVERNMENT LICENSE RIGHTS

This invention was made with U.S. government support under contract or award No. DE-EE0006521 awarded by the Department of Energy. The government has certain rights in the invention.

DISCLOSURE

This disclosure relates to an electronic assembly with a direct current (DC) bus connection.

BACKGROUND

Some prior art DC bus connections have parasitic or unwanted inductances that tend to increase the requisite size of capacitors or the requisite minimum capacitance value required to filter adequately the DC bus to reduce ripple current or noise. Accordingly, there is a need for electronic assembly with a direct current bus connection.

SUMMARY

In accordance with one embodiment, an electronic assembly comprises a direct current (DC) bus terminating in a folded outer tab and a bent inner tab. The folded outer tab comprises a first outer dielectric layer and a second outer dielectric layer that contact or overlie an outer terminal, where the outer terminal is associated with a first polarity of the DC bus. A bent inner tab comprises a first inner dielectric layer and a second inner dielectric layer that contact or overlie an inner terminal, where the inner terminal is associated with a second polarity of the DC bus that is opposite the first polarity. The folded outer tab and the bent inner tab comprise electrically conductive faces (e.g., vertical faces), of opposite polarities, formed of exposed portions of the outer terminal and the inner terminal. A module comprises a module tab projecting generally vertically from an exterior of the module. Further, the module tab comprises a central dielectric substrate that supports a first conductive pad on a first side and a second conducive pad on a second side opposite the first side. The first conductive pad and the second conductive pad engage the exposed portions of the outer terminal and the inner terminal. A clamp is configured to form an electrical and mechanical connection between the first conductive pad, the second conductive pad and the exposed portions.

DETAILED DESCRIPTION

Figure 1:
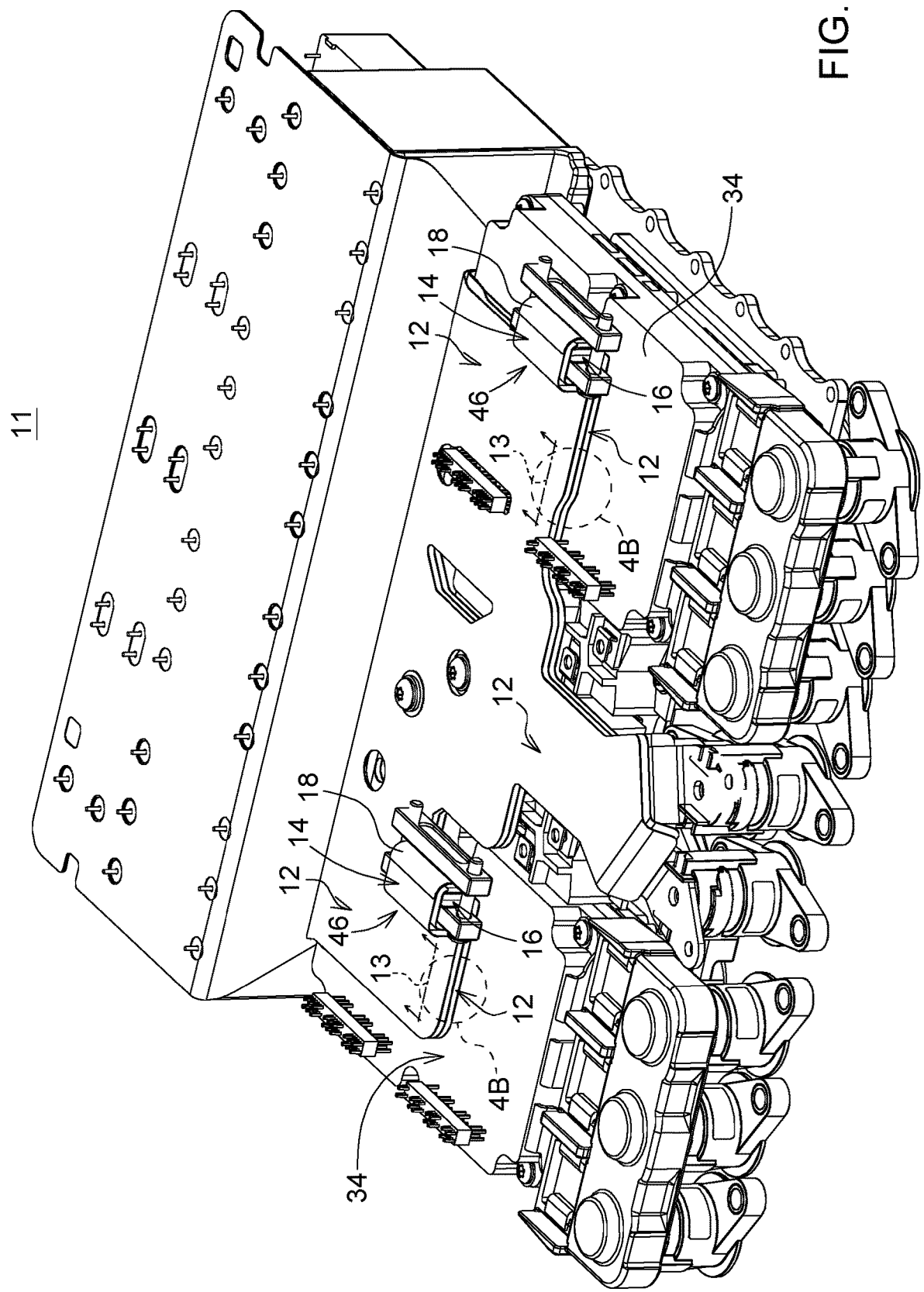
FIG. 1 is a top perspective view of an electronic assembly with a housing removed to reveal the circuit boards, components, one or more DC bus connections and other items within the housing.

In accordance with one embodiment, in FIG. 1 through FIG. 4B, inclusive, an electronic assembly 11 comprises a direct current (DC) 12 bus (e.g., DC bus assembly) terminating in a folded outer tab 14 and a bent inner tab 16. The folded outer tab 14 comprises a first outer dielectric layer 18 and a second outer dielectric layer 20 that contact or overlie an outer terminal 22, where the outer terminal 22 is associated with a first polarity, or first conductive layer 19, of the DC bus 12. A bent inner tab 16 comprises a first inner dielectric layer 26 and a second inner dielectric layer 28 that contact or overlie an inner terminal 29, where the inner terminal 29 is associated with a second polarity, or second conductive layer 21, of the DC bus 12 that is opposite the first polarity. The folded outer tab 14 and the bent inner tab 16 comprise electrically conductive faces (e.g., vertical faces 30), of opposite polarities, formed of exposed portions 32 of the outer terminal 22 and the inner terminal. A module 34 comprises a module tab 36 projecting generally vertically from an exterior 37 of the module 34. Further, the module tab 36 comprises a central dielectric substrate 38 that supports a first conductive pad 40 on a first side 42 and a second conducive pad on a second side 47 opposite the first side 42. The first conductive pad 40 and the second conductive pad 44 engage the exposed portions 32 of the outer terminal 22 and the inner terminal 29. A clamp 46 is configured to form an electrical and mechanical connection between the first conductive pad 40, the second conductive pad 44 and the exposed portions 32.

Figure 4A:
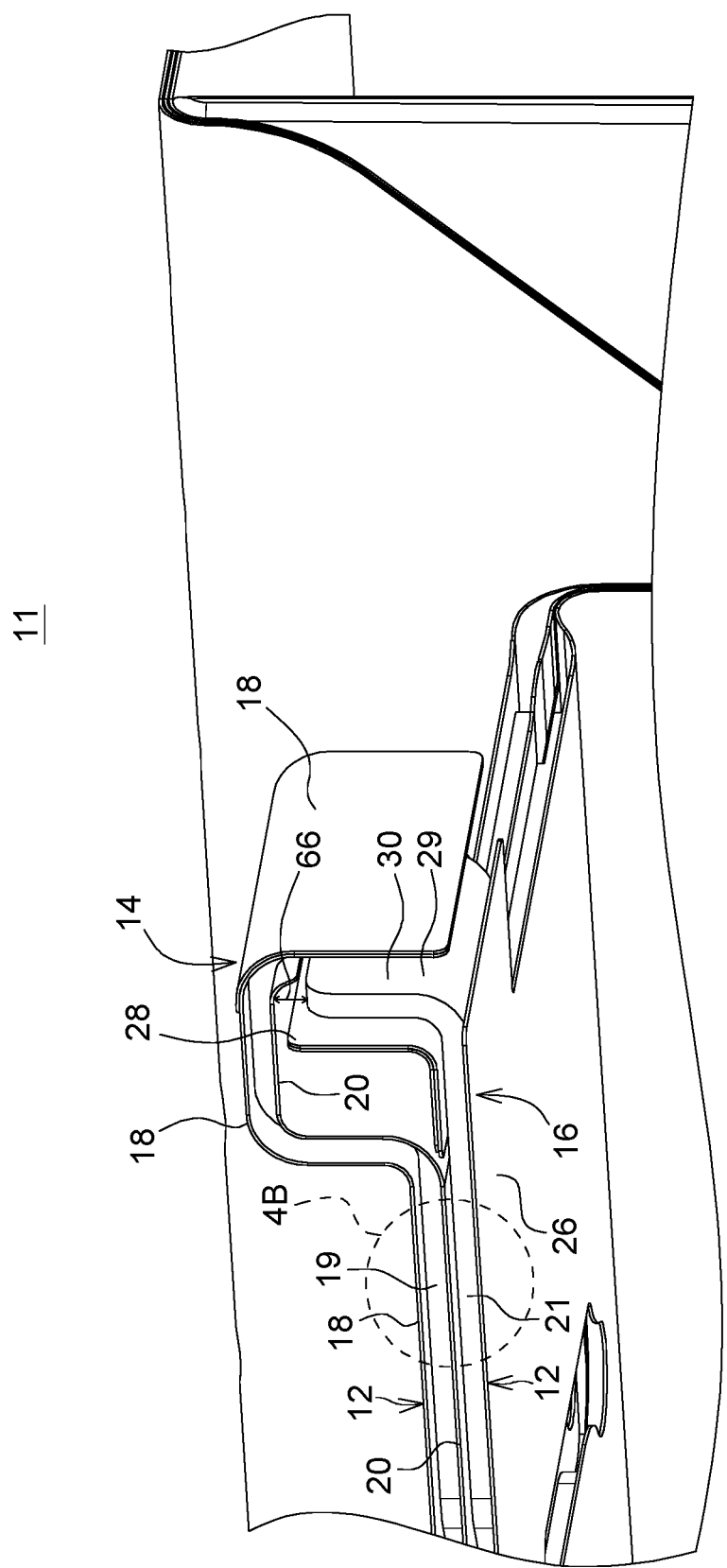
FIG. 4A is a side perspective view of the DC bus connection with the clamp removed to reveal the folded tab and module tab in greater detail.
Figure 4B:
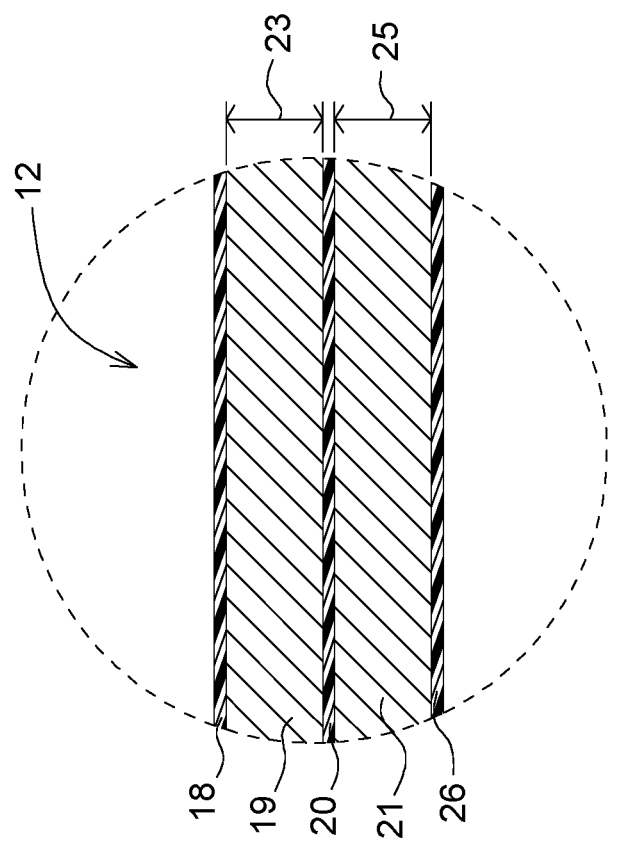
FIG. 4B is an enlarged cross-sectional view of the circular region 4B as viewed along a reference axis 13 of FIG. 1.

FIG. 4B illustrates an enlarged circular cross section 4B of FIG. 1 and FIG. 4A taken along reference axis 13 of FIG. 1. In one embodiment, the DC bus 12 (e.g., DC bus assembly) may comprise two conductive layers (19, 21) of opposite polarity that are electrically isolated from each other by an intermediate dielectric layer, such as a second outer dielectric layer 20 or a dielectric film. Further, a first outer dielectric layer 18 (e.g., first dielectric film or sheath) overlies a first conductive layer 19; a first inner dielectric layer 26 (e.g., second dielectric film or sheath) overlies a second conductive layer 21. The first conductive layer 19 has a corresponding first thickness 23; the second conductive layer 21 has a corresponding second thickness 25. In certain configurations, the first thickness and the second thickness are approximately two millimeters or greater; the first conductive layer 19 and the second conductive layer 21 are composed of copper, a copper alloy, aluminum, an aluminum alloy, or other suitable metals or alloys. Any of the dielectric layers (18, 20, 26) may be composed of a polymer, a plastic, an elastomer, or the like, such as nylon sheet with aramid fibers. Collectively, the DC bus may refer to the first conductive layer 19, the second conductive layer 21, the dielectric layer 20 (e.g., intermediate dielectric layer), dielectric layer 18 (e.g., first dielectric film) and the dielectric layer 26 (e.g., second dielectric film).

In one embodiment, the exposed portions 32 of the folded outer tab 14 and bent inner tab 16 may be composed of a copper layer, a copper alloy layer, aluminum layer, or aluminum alloy layer, aluminum layer, or aluminum alloy layer, or another metal layer that is approximately a thickness of 2 millimeters or greater.

Figure 2:
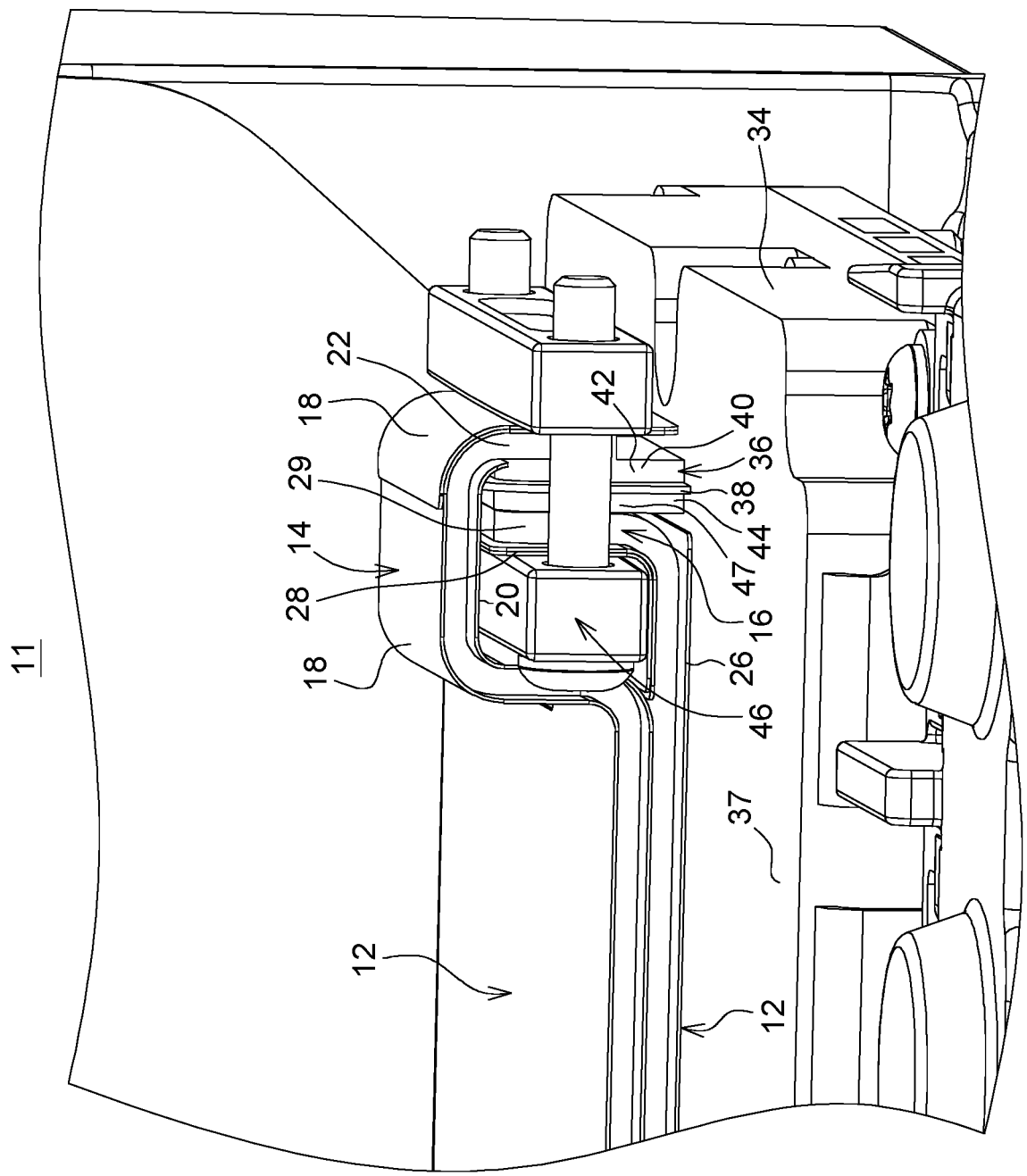
FIG. 2 is an enlarged view the assembled DC bus connection of FIG. 1.
Figure 3:
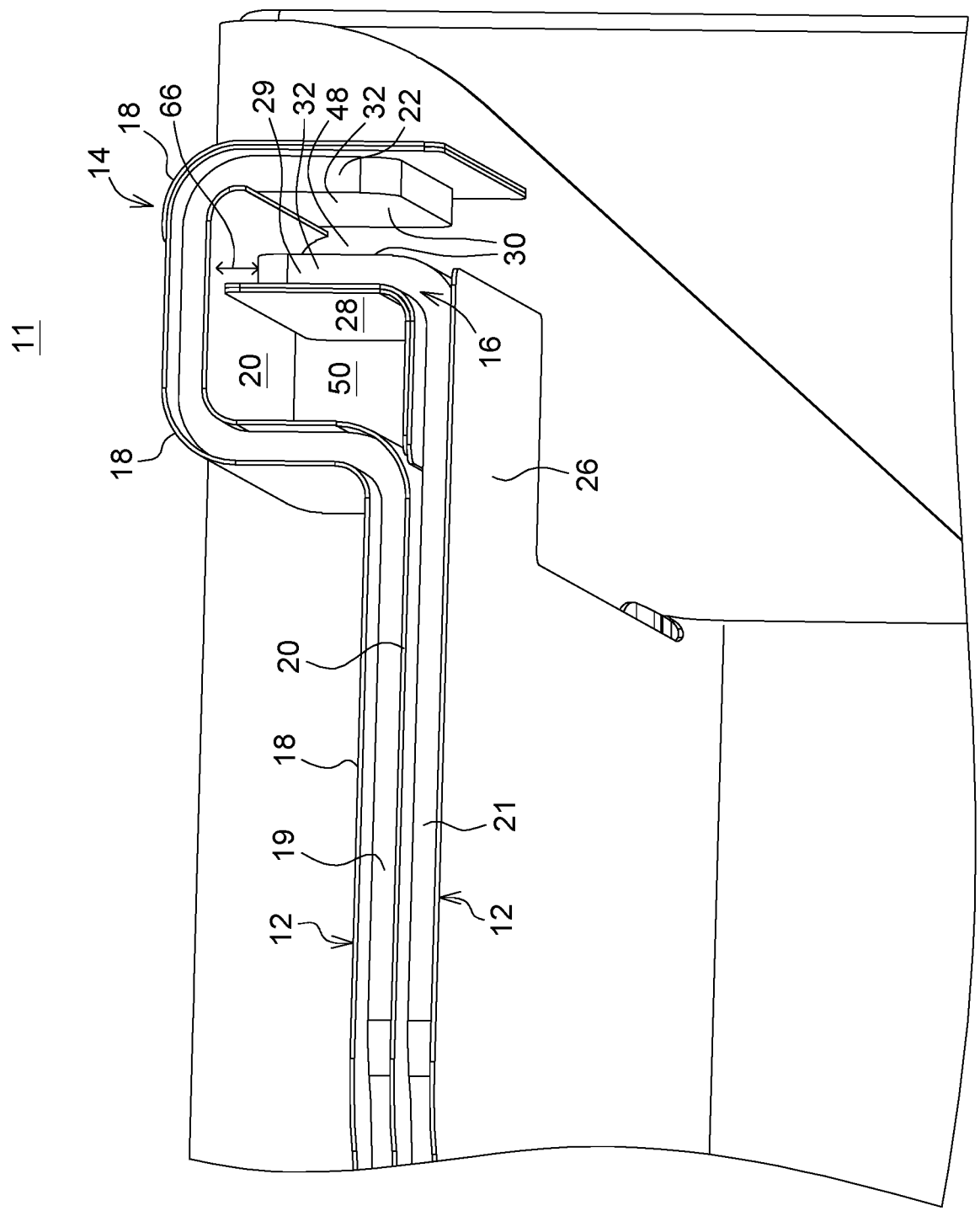
FIG. 3 is an enlarged view of the DC bus connection with the clamp removed to reveal the folded tab and module tab in greater detail.

As shown in FIG. 2, a clamp 46 is configured to form an electrical and mechanical connection between the first conductive pad 40, the second conductive pad 44 and the exposed (e.g., vertical faces 30). For example, in one embodiment the folded outer tab 14 forms a first recess 48 for receiving the module tab 36 and a second recess 50 for receiving a portion of a clamp 46 member of the conductive clamp 46. Further, in one configuration, the second outer dielectric layer 20 is electrically isolated from and spaced apart from the inner terminal 29 by a clearance gap 66.

Figure 7:
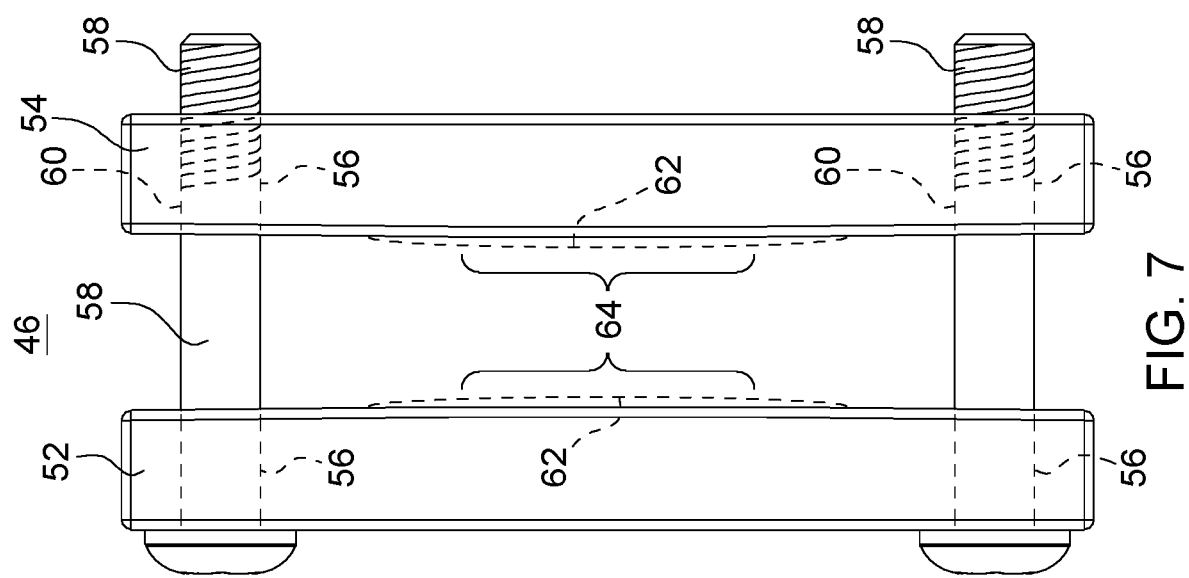
FIG. 7 is a top view of the clamp.
Figure 6:
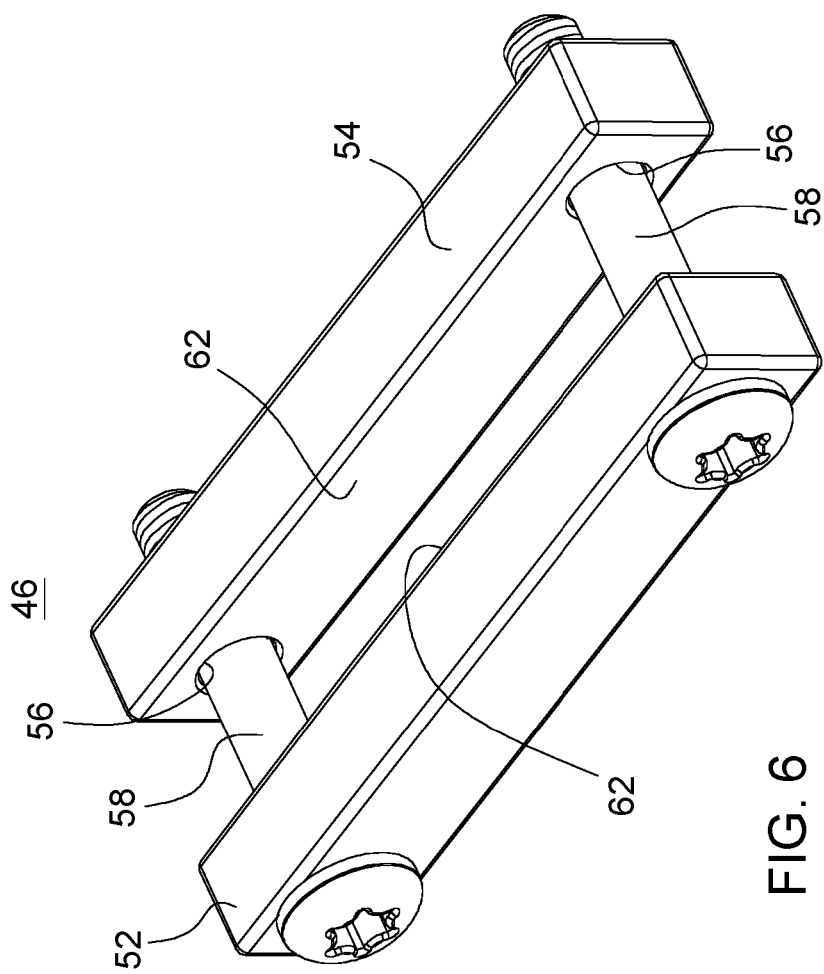
FIG. 6 is a perspective view of the clamp.

In one illustrative example, as best illustrated in FIG. 6 and in FIG. 7, the clamp 46 comprises a first clamp member 52 and a second clamp member 54 spaced apart from the first clamp member 52. Further, there are openings 56 in the first clamp member 52 and second clamp member 54; the openings 56 are arranged to receive threaded fasteners 58 to apply compressive forces to the first clamp member 52 and second clamp member 54.

The clamp 46 can be configured in accordance with various illustrative configurations, which may be applied separately or cumulatively. Under a first configuration, a first pair of bores is located in the first clamp member 52; the first claim member is configured to receive the threaded fastener. A second pair of threaded bores 60 is disposed in the second clamp member 54 for engaging the threaded fastener.

Under a second configuration, the first clamp member 52 and the second clamp member 54 each a have crowned face or convex face 62 for contacting for contacting the folded outer tab 14 and the bent inner tab 16. For example, an outermost outwardly projecting portion 64 of the crowned face or convex face 62 contacts a first outer dielectric layer 18 of the folded outer tab 14 and a second inner dielectric layer 28 of the bent inner tab 16.

Under a third configuration, the clamp 46 provides an evenly distributed compressive force to the exposed portions 32, the first pad and the second pad to reduce the electrical resistance to approximately three micro-ohms or lower. Accordingly, the first clamp member 52 and the second clamp member 54 may be formed of spring steel, or another suitable elastically deformable metal alloy, to facilitate the evenly distributed compressive force when the first clamp member 52 and the second clamp member 54 are screwed together to elastically deform the crowned face or convex face 62 to a substantially planar surface in contact with the folded outer tab 14 and the bent inner tab 16.

In practice, the mechanical and electrical DC connection can be enhanced the shape and material composition of the clamp 46 (e.g., bar clamps). In some embodiments, the first clamp member 52 and the second clamp member 54 are made from a good quality carbon steel, sprint steel, or other materials with durability and usable modulus of elasticity. Further, a crowned, convex or slight parabolic shape is formed into the clamping surface or face of the first clamp member 52 and the second clamp member 54. When the clamp 46 (e.g., bar clamp 46) is screwed together, the modulus of the material is used to create evenly distributed spring force on the DC bus 12 connection. Accordingly, the clamp 46 structure is well suited for providing a reliable, evenly distributed compressive force of the clamp 46, which can reduce the electrical resistance of the DC connection (between the exposed portions 32 and the first conductive pad 40 and the second conductive pad 44) to values not seen by other methods in industry. For example, the electrical resistance of the DC connection can be reduced to be equal to or lower than approximately 3 micro ohms. Further, the mechanical properties of the DC connection are superior because of the evenly distributed force creates an electrical joint that exceeds a typical or conventional single bolt DC bus 12 connection.

In one embodiment, the inner terminal 29 and the outer terminal 22 are composed of copper or a copper alloy. For example, the inner terminal 29 and the outer terminal 22 are composed of a copper layer, a copper alloy layer, aluminum layer, or aluminum alloy layer, aluminum layer, or aluminum alloy layer, or another metal layer that is approximately a thickness of 2 millimeters or greater.

Any of the electric bus structures, such as the inner terminal 29 and the outer terminal 22 may be composed of type 1350 aluminum, 8000 series aluminum for conductors with generally elliptical or circular cross sections, or 6101 aluminum.

In one configuration, dielectric or insulation layers are used to ensure electrical insulation is kept between the two polarity layers or aggregate laminations (e.g., positive DC bus 12 and negative DC bus 12) of the laminated bus structure as well as the details of the clamp 46.

Although other suitable insulation or dielectric materials can be used, such as plastics, polymers or composites, in one configuration nylon sheet with aramid fibers, such as NOMEX® 410 fiber electrical insulation can be used to maintain electrical separation of the polarities as well as the clamp 46. Other insulation could be used as long as the materials toughness is robust enough to maintain electrical isolation through the lifetime of the associated electrical assembly. NOMEX is a trademark or registered trademark of E. I. Du Pont de Nemours and Company, of Wilmington, Del.

Figure 5:
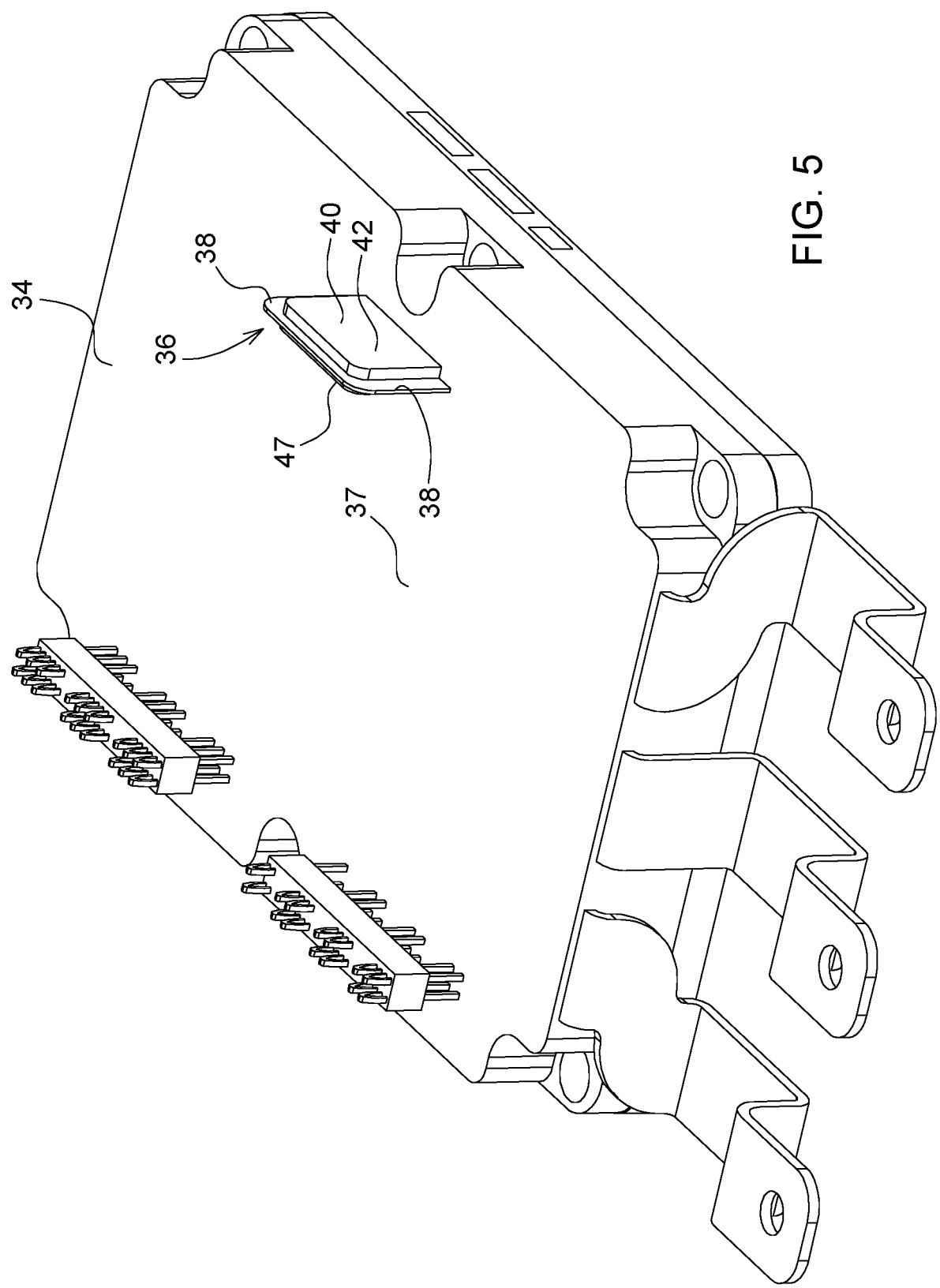
FIG. 5 is a perspective view of a module, such as switching module (e.g., an inverter or converter).

In FIG. 5, the module 34 may comprise a power inverter module 34 or a power DC-to-DC converter module 34 that receives direct current (DC) power via the modular tab or electrical connection to the outer terminal 22 and the inner terminal 29. The module tab 36 projects outward and above an exterior 37 or outer enclosure surface that is composed of a dielectric material. The inner terminal 29 and the outer terminal 22 conduct thermal energy from the module 34 via the module tab 36. The module tab 36 is associated with the central dielectric substrate 38 that isolates the opposite polarities of the DC bus 12, or the first conductive pad 40 and the second conductive pad 44. Accordingly, the central dielectric substrate 38 may be composed of ceramic material, a ceramic filled plastic, a ceramic filled polymer, a polymer composite a plastic composite, or a fiber (e.g., glass, carbon or ceramic) filler embedded in a resin, plastic or polymer matrix.

The DC connection can be manufactured or made as follows. First, a first strip is cut from a laminated substrate comprising a first outer dielectric layer 18 and a second dielectric layer that contact or overlie an outer terminal 22 layer (e.g., of electrically conductive material, such as copper or copper alloy).

Second, the strip of the laminated substrate is bent several times (e.g., thrice) to form a folded outer tab 14 with a recess, where the folded outer tab 14 can also be referred to as a tong.

Third, a second strip of the substrate is separated from the first strip of the substrate, where the second strip comprises a first inner dielectric layer 26 and a second inner dielectric layer 28 that contact or overlie an inner terminal 29 layer (e.g., of electrically conductive material, such as copper or copper alloy).

Fourth, the second strip is bent (e.g. once) to form a bent inner tab 16 that juts upward from the laminated second strip at a substantially orthogonal angle, where the bent inner tab 16 has a substantially similar size and shape, which generally mirrors a size and shape of the folded outer tab 14, and where the bent inner tab 16 is allowed to fit into a first recess 48 formed by the folded outer tab 14 that leaves an air gap (e.g., vertical air gap) between an upper portion of the bent inner tab 16 and a facing portion (e.g., generally horizonal face) of the folded outer tab 14. For example, the second strip is separated from the folded outer tab 14 or the tong by a clearance amount or air gap and a second recess 50 remains.

Fifth, a module tab 36 of a power module 34 is inserted into the second recess 50 between the folded outer tab 14 and the module tab 36. Finally, once the DC bus 12 and power module 34 are mated together, a clamp 46 (e.g., bar clamp 46) is then applied ensure two intimate, separate polarity mechanical and electrical connection between the three components/segments including, but not limited to the following: (a) an outer terminal 22 of folded outer tab 14, (2) an inner terminal 29 of the bent inner tab 16, and (3) the first conductive pad 40 of the module tab 36, the second conductive pad 44 of module tab 36, or both the first conductive pad 40 and the second conductive pad 44. In particular, a first polarity connection of the DC bus 12 is between the outer terminal 22 and the first conductive pad 40; a second polarity connection of the DC bus 12 is between the inner terminal 29 and the second conductive pad 44, as illustrated. The first polarity and the second polarity are opposite polarities. If the first polarity is positive DC voltage than the second polarity must be negative DC voltage; vice versa.

In this disclosure, the drawings show the DC bus 12 connection with the clamp 46 that separates the positive and negative bus laminations. However, additional modifications to the structure can be accommodated so the positive and negative laminations or layers are not separated by the clamp 46 to reduce the inductance of the formed electrical DC connection, below the inductance values that are lower than those of a convention or typical single bolt DC bus 12 connection.

The DC bus 12 connection of the electronic assembly 11 is well suited for manufacturing via a low cost laminated bus structure. Moreover, the laminated bus structure of the DC bus 12 connection facilitates a low inductance connection between a power electronic module 34 (e.g., inverter) and the DC bus 12.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

The following is claimed:

1. An electronic assembly comprising:
a direct current (DC) bus terminating in a folded outer tab and a bent inner tab; the folded outer tab comprising a first outer dielectric layer and a second outer dielectric layer contacting or overlying an outer terminal, the outer terminal associated with a first polarity of the DC bus;
the bent inner tab comprising a first inner dielectric layer a second inner dielectric layer contacting or overlying an inner terminal, the inner terminal associated with a second polarity of the DC bus that is opposite the first polarity, wherein the folded outer tab and the bent inner tab have electrically conductive vertical faces, of opposite polarities, formed of exposed portions of the outer terminal and the inner terminal;
a module comprising a module tab projecting generally vertically from an exterior of the module, the module tab comprising a central dielectric substrate that supports a first conductive pad on a first side and a second conductive pad on a second side opposite the first side; the first conductive pad and the second conductive pad engaging the exposed portions; and
a clamp for forming an electrical and mechanical connection between the first conductive pad, the second conductive pad and the exposed portions.

2. The electronic assembly according to claim 1 wherein the folded outer tab forms a first recess for receiving the module tab and a second recess for receiving a portion of a clamp member of the conductive clamp.

3. The electronic assembly according to claim 1 wherein the clamp comprises:
a first clamp member;
a second clamp member spaced apart from the first clamp member;
a plurality of openings in the first clamp member and second clamp member, the openings arranged to receive threaded fasteners to apply compressive forces to the first clamp member and second clamp member.

4. The electronic assembly according to claim 1 wherein the openings comprise:
a first pair of bores in the first clamp member for receiving the threaded fastener; and
a second pair of threaded bores in the second clamp member for engaging the threaded fastener.

5. The electronic assembly according to claim 1 wherein the first clamp member and the second clamp member each a have crowned face or convex face for contacting the folded outer tab and the bent inner tab.

6. The electronic assembly according to claim 5 wherein an outermost outwardly projecting portion of the crowned face or convex face contacts a first outer dielectric layer of the folded outer tab and a second inner dielectric layer of the bent inner tab.

7. The electronic assembly according to claim 1 wherein the second outer dielectric layer is electrically isolated from and spaced apart from the inner terminal by a clearance gap.

8. The electronic assembly according to claim 1 wherein the module comprises a power inverter module that receives direct current power via the electrical connection of the module tab.

9. The electronic assembly according to claim 8 wherein the inner terminal and the outer terminal conduct thermal energy from the module via the module tab.

10. The electronic assembly according to claim 1 wherein the inner terminal and the outer terminal are composed of copper, a copper alloy, aluminum or an aluminum alloy.

11. The electronic bus assembly according to claim 1 wherein the inner terminal and the outer terminal are composed of a metal layer that is approximately a thickness of 2 millimeters or greater.

12. The electronic assembly according to claim 1 wherein the clamp provides an evenly distributed compressive force to the exposed portions (of the outer terminal and the inner terminal), the first conductive pad, and the second conductive pad to reduce an electrical resistance between the outer terminal and the first conductive pad and an electric resistance between the inner terminal and the second conductive pad to approximately three micro-ohms or lower.

* * * * *